(12) United States Patent
Takenaka

(10) Patent No.: US 8,401,047 B2
(45) Date of Patent: Mar. 19, 2013

(54) SEMICONDUCTOR LASER DEVICE

(75) Inventor: Yoshiaki Takenaka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/321,680

(22) PCT Filed: Feb. 28, 2011

(86) PCT No.: PCT/JP2011/001133
§ 371 (c)(1),
(2), (4) Date: Nov. 21, 2011

(87) PCT Pub. No.: WO2011/111328
PCT Pub. Date: Sep. 15, 2011

(65) Prior Publication Data
US 2012/0320938 A1    Dec. 20, 2012

(30) Foreign Application Priority Data

Mar. 10, 2010    (JP) .................................. 2010-052698

(51) Int. Cl.
*H01S 3/04*    (2006.01)
(52) U.S. Cl. .............................. 372/36; 372/35; 372/34
(58) Field of Classification Search ................... 372/36, 372/35, 34
See application file for complete search history.

(56) References Cited

U.S. PATENT DOCUMENTS

| | | | |
|---|---|---|---|
| 5,127,068 A | 6/1992 | Baer | |
| 6,097,744 A * | 8/2000 | Takigawa et al. | 372/34 |
| 6,245,589 B1 | 6/2001 | Takigawa | |
| 6,266,881 B1 | 7/2001 | Takigawa | |
| 6,387,286 B1 * | 5/2002 | Takigawa et al. | 216/41 |
| 6,643,302 B1 * | 11/2003 | Nishikawa et al. | 372/35 |
| 2006/0227827 A1 | 10/2006 | Kawanishi | |
| 2010/0202479 A1 | 8/2010 | Miyajima | |

FOREIGN PATENT DOCUMENTS

| | | |
|---|---|---|
| JP | 05093828 | 4/1993 |
| JP | 10209531 | 8/1998 |
| JP | 2001044555 | 2/2001 |
| JP | 2003152259 | 5/2003 |
| JP | 2004134797 | 4/2004 |
| JP | 2004186527 | 7/2004 |
| JP | 2005268650 | 9/2005 |
| JP | 2006294943 | 10/2006 |
| JP | 2006352019 | 12/2006 |
| JP | 2007329469 | 12/2007 |

OTHER PUBLICATIONS

International Application Serial No. PCT/JP2011/001133, International Search Report mailed Mar. 29, 2011, 4 pgs.

* cited by examiner

*Primary Examiner* — Kinam Park
(74) *Attorney, Agent, or Firm* — RatnerPrestia

(57) ABSTRACT

The semiconductor laser device of the present invention has a structure that allows a cooling medium to be directly fed into heatsink disposed inside package. Besides, the structure ensures that the inside of package is kept at hermetically sealed condition. The structure suppresses temperature rise in semiconductor laser element and package, enhancing the reliability and quality of the semiconductor laser device. At the same time, a high-power semiconductor laser element can be employed.

16 Claims, 11 Drawing Sheets

SEMICONDUCTOR LASER DEVICE

This application is a U.S. National Phase application of PCT International Application No. PCT/JP2011/001133.

TECHNICAL FIELD

The present invention relates to a semiconductor laser device, particularly relates to a semiconductor laser device optically connected to an optical fiber.

BACKGROUND ART

A semiconductor laser device is highly effective in converting electrical input into laser oscillation output. The advantage has increased the needs for using the semiconductor laser device for an excitation light source of a solid-state laser or a direct process light source.

The manufacturers of the semiconductor laser device have introduced a semiconductor laser bar—in which a plurality of emitters (emitting sections) is formed in a one-dimensional arrangement—to the market. To easily use laser light emitted from the emitters for the excitation light of a solid-state laser or a processing purpose, a method in which the laser light is connected to an optical fiber is well known (see Patent Literature 1, for example).

FIG. 12 shows a conventional semiconductor laser device. The semiconductor laser device has semiconductor laser element 101 for emitting laser light, heatsink 102 for cooling semiconductor laser element 101, and metallic plate 103. Before fixing metallic plate 103 to heatsink 102, electrical isolation has been provided between them.

Metallic wire 104 has bonding connection with semiconductor laser element 101 and metallic plate 103, providing electrical connection between semiconductor laser element 101 and metallic plate 103. Electrode plate 106 provides the inside of package 105 of a box shape with electric power.

Further, insulating member 107 provides electrical isolation between package 105 and electrode plate 106. Metallic member 108 connects between metallic plate 103 and electrode plate 106. Rod lens 109 collimates the laser light emitted from semiconductor laser element 101. Rod lens 109 is held by lens fixing base 110.

Fiber array 111 is formed of a bundle of optical fibers for guiding the laser light collimated by rod lens 109 to outside package 105. Optical fiber 112 guides the laser light to outside package 105.

Package 105 is sealed with lid 113. Sealing member 114 provides hermetically sealed condition between package 105 and lid 113. Sealing member 115 provides hermetically sealed condition between package 105 and optical fiber 112.

The operations of such structured semiconductor laser module will be described.

Electrical power input fed from a power supply device is brought, via package 105 and heatsink 102, to the anode side of semiconductor laser element 101, and further, the input is brought, via electrode plate 106, metallic member 108, metallic plate 103, and metallic wire 104, to the cathode side of semiconductor laser element 101. Receiving the electrical power input, semiconductor laser element 101 outputs laser light.

The laser light from the semiconductor laser element is collimated by rod lens 109 and injected into fiber array 111. Guided by optical fiber 112 to the outside of package 105, the laser light is used as excitation light for a solid-state laser or as a direct process light source.

In response to electric power supply, semiconductor laser element 101 offers laser oscillation through electrical/optical conversion. At the same time, an amount of the electric power is consumed by a resistance component of semiconductor laser element 101, by which heat is generated. In addition, laser light and the scattering light is partly absorbed. As a result, the inside of package 105 has increase in temperature.

To avoid the temperature rise caused by the heat generation, an attempt has been made. That is, the bottom of package 105 is cooled by a cooling medium or a Peltier device so as to cool down heatsink 102, semiconductor laser element 101, and the inside of package 105.

According to a conventional semiconductor laser device, however, the higher the power of semiconductor laser element 101, the larger the electric power input; at the same time, the larger the amount of heat generation. Due to lack of cooling capacity of the semiconductor laser module, the case of semiconductor laser element 101 increases in temperature, thereby degrading reliability of semiconductor laser element 101. Besides, the temperature rise inside package 105 can invite position variation of rod lens 109, thereby degrading the beam quality.

CITATION LIST

Patent Literature

[PTL1]
Japanese Patent Unexamined Publication No. H05-93828

SUMMARY OF THE INVENTION

The present invention provides a high-quality and highly reliable semiconductor laser device by increasing the cooling capacity of a semiconductor laser module so as to suppress temperature rise of a semiconductor laser element.

The semiconductor laser device has a housing, a heatsink disposed in the housing, and a laser output section attached directly or indirectly to the heatsink. The heatsink has a cooling medium passage therein. The housing has a first through-hole and a second through-hole in a wall surface. The first through-hole is for feeding a cooling medium into the cooling medium passage of the heatsink from outside the housing, while the second through-hole is for discharging the cooling medium from the cooling medium passage of the heatsink to outside the housing. A first sealing member is disposed around the periphery of the first through-hole in the housing. Similarly, a second sealing member is disposed around the periphery of the second through-hole in the housing.

The structure above allows the cooling medium to be fed into the cooling medium passage of the heatsink, enhancing cooling effect. The enhanced cooling capacity suppresses temperature rise in the housing, enhancing the reliability and quality of the semiconductor laser device. Besides, by virtue of the structure, a high-power semiconductor laser element can be employed, and accordingly, further increase in laser-light output is expected.

As an aspect of the present invention, the semiconductor laser device has a housing, a heatsink disposed in the housing, and a laser output section attached directly or indirectly to the heatsink, and a planar member disposed outside a wall surface of the wall surfaces forming the housing. The heatsink has a cooling medium passage therein. The housing has a first through-hole and a second through-hole in a wall surface positioned opposite to the planar member. A first passage-forming member is disposed inside the first through-hole, and a second passage-forming member is disposed inside the second through-hole. The first passage-forming member has a passage for feeding a cooling medium into the cooling medium passage of the heatsink. The second passage-forming member has a passage for discharging the cooling medium from the cooling medium passage of the heatsink. Further, the planar member has a third through-hole and a fourth through-hole. The third through-hole is disposed at a position that meets with the first passage-forming member so that the cooling medium is fed to the cooling medium passage of the heatsink through the hole. The fourth through-hole is disposed at a position that meets with the second passage-forming member so that the cooling medium is discharged from the cooling medium passage of the heatsink through the hole.

The structure above allows the cooling medium to be fed into the cooling medium passage of the heatsink, enhancing cooling effect. The enhanced cooling capacity suppresses temperature rise in the housing, enhancing the reliability and quality of the semiconductor laser device. Besides, by virtue of the structure, a high-power semiconductor laser element can be employed, and accordingly, further increase in laser-light output is expected.

As another aspect of the present invention, the semiconductor laser device has a housing, a heatsink disposed in the housing, and a laser output section attached directly or indirectly to the heatsink. The heatsink has a cooling medium passage therein. The housing has a first through-hole and a second through-hole in a wall surface. A first passage-forming member is disposed inside the first through-hole, and a second passage-forming member is disposed inside the second through-hole. The first passage-forming member has a passage for feeding a cooling medium into the cooling medium passage of the heatsink. The second passage-forming member has a passage for discharging the cooling medium from the cooling medium passage of the heatsink. At least any one of the first passage-forming member and the second passage-forming member has a stepped section disposed so as to fit with a portion of the first through-hole or a portion of the second through-hole in the housing.

The structure above allows the cooling medium to be fed into the cooling medium passage of the heatsink, enhancing cooling effect. The enhanced cooling capacity suppresses temperature rise in the housing, enhancing the reliability and quality of the semiconductor laser device. Besides, by virtue of the structure, a high-power semiconductor laser element can be employed, and accordingly, further increase in laser-light output is expected.

DETAILED DESCRIPTION OF THE PREFERRED EMBODIMENTS

Hereinafter, exemplary embodiments of the present invention will be described with reference to the accompanying drawings. Throughout the drawings, like parts have similar reference marks, and the description thereof may be omitted.

First Exemplary Embodiment

Figure 1:
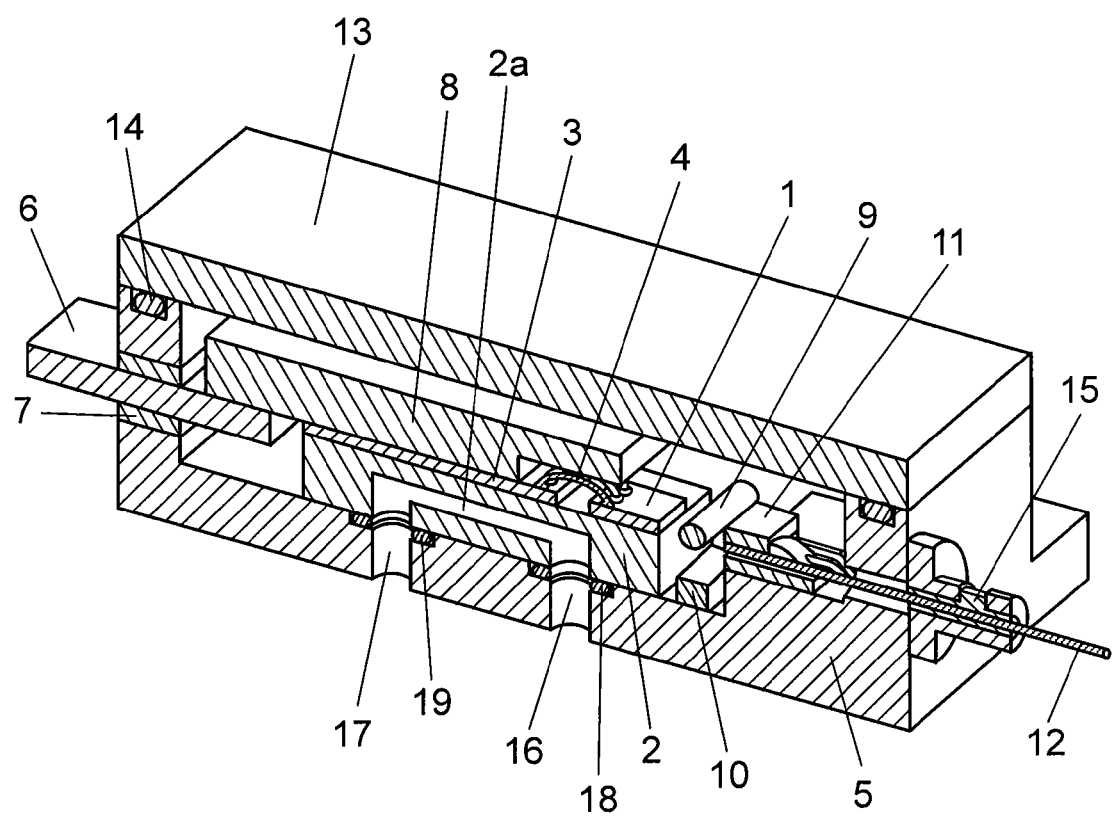
FIG. 1 is a partly cutout perspective view showing a semiconductor laser device in accordance with a first exemplary embodiment of the present invention.

FIG. 1 is a partly cutout perspective view showing a semiconductor laser device in accordance with the first exemplary embodiment of the present invention. As shown in FIG. 1, the semiconductor laser device of the embodiment has semiconductor laser element 1 for emitting laser light, heatsink 2 for cooling semiconductor laser element 1, and metallic plate 3 fixed to heatsink 2. Before metallic plate 3 is mounted on heatsink 2, electrical isolation is provided between heatsink 2 and metallic plate 3. In the embodiment, semiconductor laser element 1 is directly fixed on the upper surface of heatsink 2. However, semiconductor laser element 1 may be fixed indirectly to heatsink 2 in a way that an electrically and thermally conductive plate is sandwiched between them. Metallic wire 4 has bonding connection with semiconductor laser element 1 and metallic plate 3. Package 5 of a box shape as a housing has the bottom and the side surfaces. The top of package 5 is open into outside.

The semiconductor laser device of the embodiment has electrode plate 6 for supplying the inside of package 5 with electric power, insulating member 7 for providing electrical isolation between package 5 and electrode plate 6, and metallic member 8 for connecting between metallic plate 3 and electrode plate 6. Further, the semiconductor laser device has rod lens 9, lens fixing base 10, fiber array 11, and optical fiber 12. Rod lens 9 collimates the laser light emitted from semiconductor laser element 1. Rod lens 9 is held by lens fixing base 10. Fiber array 11 is formed of a bundle of optical fibers for guiding the laser light collimated by rod lens 9 to outside package 5. Optical fiber 12 is the output section of the semiconductor laser device, guiding the laser light to outside package 5. The top opening of package 5 is sealed with lid 13. Sealing member 14 provides hermetically sealed condition between package 5 and lid 13.

That is, sealing member 14 is disposed along the periphery of the top opening of package 5. Covering the top opening of package 5 with lid 13 while pressing down sealing member 14 establishes hermetically sealed condition inside the housing surrounded by package 5 and lid 13.

Sealing member 15 provides hermetically sealed condition between package 5 and optical fiber 12, which also establishes hermetically sealed condition inside package 5. First through-hole 16 and second through-hole 17 vertically run through the bottom of package 5.

First through-hole 16 and second through-hole 17 are disposed so as to meet with cooling medium passage 2a formed in heatsink 2. That is, cooling medium enters through first through-hole 16 into cooling medium passage 2a, flows through it, and goes outside package 5 through second through-hole 17.

First sealing member 18 prevents the cooling medium from leakage into the inside of package 5. First sealing member 18 is disposed around the periphery of first through-hole 16, i.e., around the connecting position of heatsink 2 and first through-hole 16 on the bottom of package 5. First sealing member 18 is pressed by heatsink 2 toward package 5.

Similarly, second sealing member 19 prevents the cooling medium from leakage into the inside of package 5. Second sealing member 19 is disposed around the periphery of second through-hole 17, i.e., around the connecting position of heatsink 2 and second through-hole 17 on the bottom of package 5. Second sealing member 19 is pressed by heatsink 2, too, toward package 5.

The operations of the semiconductor laser module containing the semiconductor laser device having the structure above will be described.

Electrical power input fed from a power supply device is brought, via package 5 and heatsink 2, to the anode side of semiconductor laser element 1, and further, the input is brought, via electrode plate 6, metallic member 8, metallic plate 3, and metallic wire 4, to the cathode side of semiconductor laser element 1. Receiving the electrical power input, semiconductor laser element 1 outputs laser light through electrical/optical conversion.

The laser light from the semiconductor laser element is collimated by rod lens 9 and effectively injected into fiber array 11. Guided by optical fiber 12 to the outside of package 5, the light emitted from the semiconductor laser module is used as excitation light for a solid-state laser or as a direct process light source.

In response to electric power supply, semiconductor laser element 1 offers laser oscillation through electrical/optical conversion. At the same time, an amount of the electric power is consumed by a resistance component of semiconductor laser element 101, that is, semiconductor laser element 1 itself generates heat. In high temperatures, semiconductor laser element 1 fails to hold flowing electric current into an effective area for electrical/optical conversion, by which efficiency of laser oscillation decreases. Besides, temperature rise increases electric power for obtaining an equivalent amount of light output. Further, the temperature rise accelerates degradation of semiconductor laser element 1, resulting in shortened life time.

The higher the power of semiconductor laser element 101, the larger the electric power input; at the same time, the larger the amount of heat generation.

To address the problems above, the semiconductor laser device of the embodiment has an improved structure capable of suppressing temperature rise of semiconductor laser element 1 by increased cooling capacity of heatsink 2 for cooling semiconductor laser element 1. Specifically, the temperature rise of semiconductor laser element 1 is suppressed by passing a cooling medium directly through cooling medium passage 2a that is formed in heatsink 2 at a part close to semiconductor laser element 1. The cooling medium is fed into passage 2a via first through-hole 16 of package 5 and discharged from passage 2a via second through-hole 17 of package 5.

With the structure above, heatsink 2 increases its cooling capacity, which suppresses temperature rise of semiconductor laser element 1 and therefore enhances reliability and quality of the semiconductor laser device. This allows a semiconductor laser device to have further powerful output.

The semiconductor laser device of the present invention has housing 5, heatsink 2 disposed in housing 5, and laser output section 1 fixed directly or indirectly to heatsink 2. Heatsink 2 has cooling medium passage 2a therein. First through-hole 16 and second through-hole 17 are formed in a wall surface of housing 5 of the semiconductor laser device. First sealing member 18 is disposed around the periphery of first through-hole 16 in housing 5. Similarly, second sealing member 19 is disposed around the periphery of second through-hole 17. A cooling medium is fed from outside housing 5 into cooling medium passage 2a of heatsink 2 through first through-hole 16, and discharged from cooling medium passage 2a of heatsink 2 to outside housing 5 through second through-hole 17. Laser output section 1 includes semiconductor laser element 1.

The structure above allows the cooling medium to be fed into cooling medium passage 2a of heatsink 2, enhancing cooling effect. The enhanced cooling capacity suppresses temperature rise of the inside of housing 5 and also of semiconductor laser element 1, enhancing the reliability and quality of the semiconductor laser device. Besides, by virtue of the structure, a high-power semiconductor laser element can be employed, and accordingly, a semiconductor laser device having further powerful output of laser light is expected.

Second Exemplary Embodiment

Figure 2:
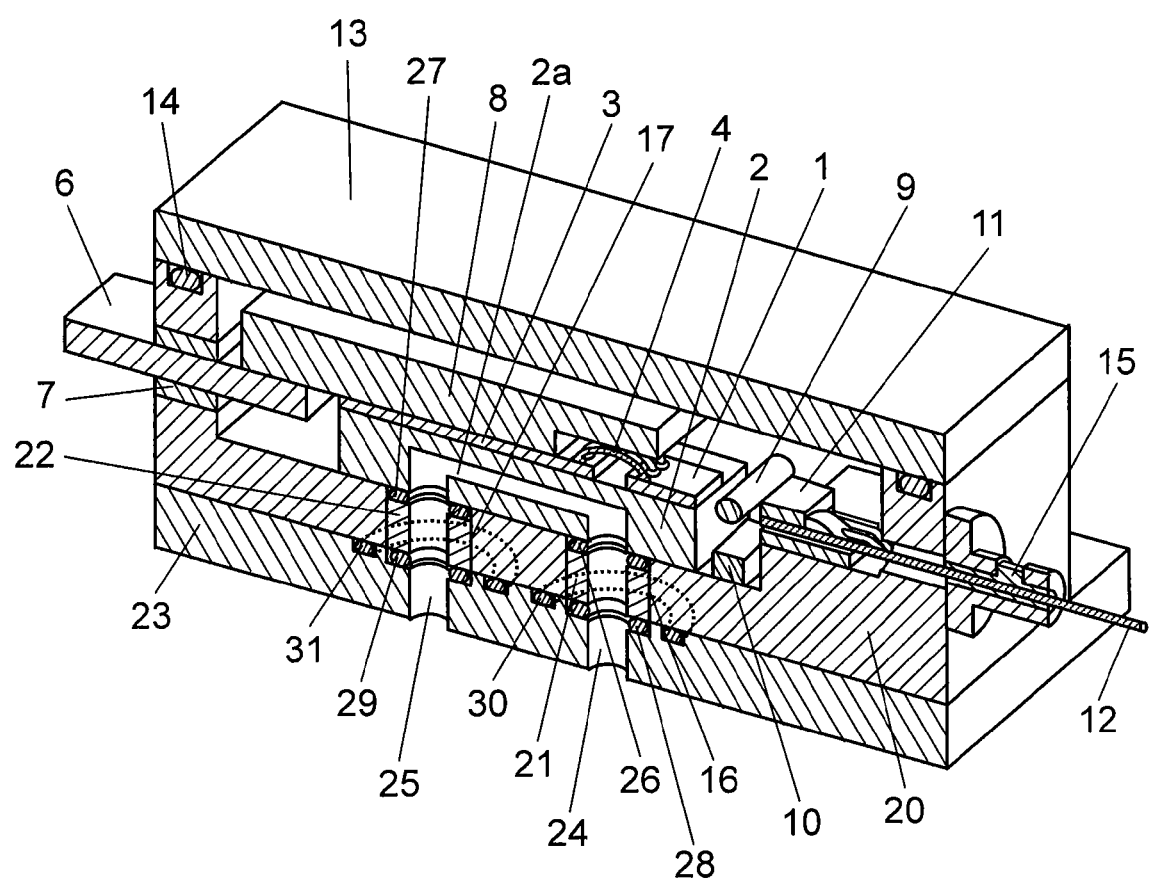
FIG. 2 is a partly cutout perspective view showing a semiconductor laser device in accordance with a second exemplary embodiment of the present invention.

FIG. 2 through FIG. 5 are partly cutout perspective views showing a semiconductor laser device in accordance with the second exemplary embodiment of the present invention. As shown in FIG. 2, first passage-forming member 21 and second passage-forming member 22 are disposed in the housing, e.g. package 20 of a box shape. Planar member 23, which is disposed on the bottom side of package 20, has third through-hole 24 and fourth through-hole 25 at positions that meet with first through-hole 16 and second through-hole 17, respectively. First sealing member 26 is disposed between heatsink 2 and first passage-forming member 21 so as to prevent the cooling medium from leakage into the inside of package 20 when the cooling medium flows through first through-hole 16 and second through-hole 17. Similarly, second sealing member 27 is disposed between heatsink 2 and second passage-forming member 22 so as to prevent the cooling medium from leakage into the inside of package 20. Third sealing member 28 is disposed between first passage-forming member 21 and third through-hole 24 so as to prevent the cooling medium from leakage into the outside of the package. Similarly, fourth sealing member 29 is disposed between second passage-forming member 22 and fourth through-hole 25 so as to prevent the cooling medium from leakage into the outside of the package.

Fifth sealing member 30 is disposed around the periphery of third sealing member 28 between package 20 and planar member 23 so as to retain hermetically sealed condition of the inside of package 20. Similarly, sixth sealing member 31 is disposed around the periphery of fourth sealing member 29 between package 20 and planar member 23 so as to retain hermetically sealed condition of the inside of package 20.

The semiconductor laser device of the embodiment has package 20, heatsink 2 disposed in package 20, semiconductor laser element 1 (i.e. laser output section 1), and planar member 23. Heatsink 2 has cooling medium passage 2a therein. Semiconductor laser element 1 is fixed directly or indirectly to heatsink 2. Planar member 23 is disposed on the bottom of package 20.

Package 20 has first through-hole 16 and second through-hole 17 in a wall surface positioned opposite to planar member 23. First passage-forming member 21 of a cylindrical shape is disposed inside first through-hole 16, and second passage-forming member 22 is disposed inside second through-hole 17. First passage-forming member 21 has a passage for feeding a cooling medium into cooling medium passage 2a of the heatsink 2. Second passage-forming member 22 has a passage for discharging the cooling medium from cooling medium passage 2a of heatsink 2.

Further, planar member 23 has third through-hole 24 and fourth through-hole 25. Third through-hole 24 is disposed at a position that meets with first passage-forming member 21 so that the cooling medium is fed to cooling medium passage 2a of heatsink 2 through the hole. Fourth through-hole 25 is disposed at a position that meets with second passage-forming member 22 so that the cooling medium is discharged from cooling medium passage 2a of heatsink 2 through the hole.

That is, the semiconductor laser device of the present invention has housing 20, heatsink 2 disposed in housing 20, laser output section 1 directly or indirectly fixed to heatsink 2, and planar member 23 disposed outside a wall surface of the wall surfaces forming housing 20.

Housing 20 has first through-hole 16 and second through-hole 17 in a wall surface positioned opposite to planar member 23. First passage-forming member 21 is disposed inside first through-hole 16, and second passage-forming member 22 is disposed inside second through-hole 17. First passage-forming member 21 has a passage for feeding a cooling medium into cooling medium passage 2a of the heatsink 2. Second passage-forming member 22 has a passage for discharging the cooling medium from cooling medium passage 2a of heatsink 2.

Further, planar member 23 has third through-hole 24 and fourth through-hole 25. Third through-hole 24 is disposed at a position that meets with first passage-forming member 21 so that the cooling medium is fed to cooling medium passage 2a of heatsink 2 through the hole. Fourth through-hole 25 is disposed at a position that meets with second passage-forming member 22 so that the cooling medium is discharged from cooling medium passage 2a of heatsink 2 through the hole.

The structure above allows the cooling medium to be fed into cooling medium passage 2a of heatsink 2, enhancing cooling effect. The enhanced cooling capacity suppresses temperature rise of the inside of housing 20 and also of semiconductor laser element 1, enhancing the reliability and quality of the semiconductor laser device. Besides, by virtue of the structure, a high-power semiconductor laser element can be employed, and accordingly, a semiconductor laser device having further powerful output of laser light is expected.

Hereinafter, the features of the semiconductor laser device of the second embodiment will be described in comparison with the semiconductor laser device of the first embodiment.

According to the structure shown in FIG. 1 of the first embodiment, when a cooling medium is fed into heatsink 2, the cooling medium flows through first through-hole 16 and second through-hole 17 of package 5. At the same time, electric power is supplied to the anode side of semiconductor laser element 1. Therefore, copper or gold-plated copper alloy, which has high corrosion resistance and high electrical conductivity, is usually employed for the material of package 5.

However, copper is an expensive material and therefore it is not suitable for mass production at low cost. In addition, providing gold plating invites further cost rise.

According to the semiconductor laser device of the second embodiment, first passage-forming member 21, second passage-forming member 22, and planar member 23—which directly contact with the cooling medium—are made of a material having high corrosion resistance but low electrical conductivity, such as stainless and resin. In contrast, package 20 having no contact with the cooling medium is made of a material having low corrosion resistance but high electrical conductivity, for example, aluminum alloy.

Stainless, resin, and aluminum alloy is easily processed by molding, die-casting, and a lost-wax process. Besides, mass-production contributes to significant reduction in production cost. Sealing members 26, 27, 28, and 29 prevent the cooling medium from leakage to the outside, and sealing members 30 and 31 keep the inside of package 20 at hermetically sealed condition.

Figure 3:
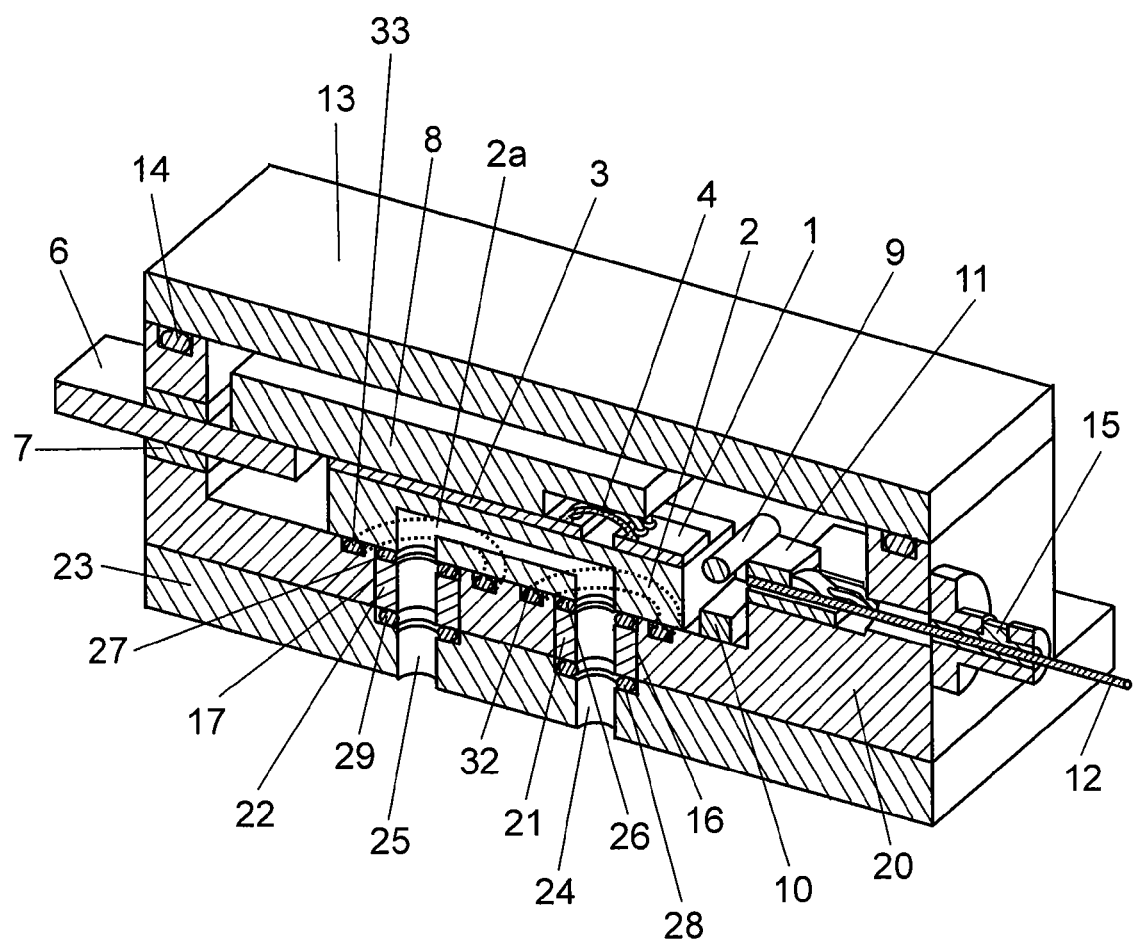
FIG. 3 is a partly cutout perspective view showing the semiconductor laser device in accordance with the second exemplary embodiment of the present invention.

Sealing members 30 and 31, which keep the inside of package 20 at hermetically sealed condition, may be disposed between heatsink 2 and package 20, like sealing members 32 and 33 shown in FIG. 3. That is, sealing members 30 and 31 may be disposed around the periphery of sealing members 27 and 28, respectively.

That is, the semiconductor laser device of the present invention has first sealing member 26, second sealing member 27, third sealing member 28, fourth sealing member 29. In addition, fifth sealing member 30 is disposed around the periphery of third sealing member 28 between housing 20 and planar member 23, and sixth sealing member 31 is disposed around the periphery of fourth sealing member 29 between housing 20 and planar member 23. First sealing member 26 is disposed at the periphery of the connecting section of heatsink 2 and first passage-forming member 21. Second sealing member 27 is disposed at the periphery of the connecting section of heatsink 2 and second passage-forming member 22. Third sealing member 28 is disposed at the periphery of the connecting section of planar member 23 and first passage-forming member 21. Fourth sealing member 29 is disposed at the periphery of the connecting section of planar member 23 and second passage-forming member 22.

The structure above allows the cooling medium to be fed into cooling medium passage 2a of heatsink 2, enhancing cooling effect. The enhanced cooling capacity suppresses temperature rise of the inside of housing 20. In addition, doubly-provided sealing members block leakage of the cooling medium and ensure that the inside of package 20 is kept at hermetically sealed condition.

The semiconductor laser device of the present invention has first sealing member 26, second sealing member 27, third sealing member 28, fourth sealing member 29. In addition, fifth sealing member 32 is disposed around the periphery of first sealing member 26 between housing 20 and heatsink 2, and sixth sealing member 33 is disposed around the periphery of second sealing member 27 between housing 20 and heatsink 2. First sealing member 26 is disposed at the periphery of the connecting section of heatsink 2 and first passage-forming member 21. Second sealing member 27 is disposed at the periphery of the connecting section of heatsink 2 and second passage-forming member 22. Third sealing member 28 is disposed at the periphery of the connecting section of planar member 23 and first passage-forming member 21. Fourth sealing member 29 is disposed at the periphery of the connecting section of planar member 23 and second passage-forming member 22.

The structure above allows the cooling medium to be fed into cooling medium passage 2a of heatsink 2, enhancing cooling effect. The enhanced cooling capacity suppresses temperature rise of the inside of housing 20. In addition, doubly-provided sealing members block leakage of the cooling medium and ensure that the inside of package 20 is kept at hermetically sealed condition.

Besides, housing 20 is made of a metal containing aluminum as a major component, while first passage-forming member 21, second passage-forming member 22, and planar member 23 are made of a material having a corrosion resistance higher than that of aluminum.

The material selection above prevents passage-forming members having direct contact with the cooling medium (i.e. first passage-forming member 21, second passage-forming member 22, and planar member 23) from corrosion. As a result, semiconductor laser element 1 is efficiently cooled by the cooling medium, by which temperature rise in the device is suppressed.

In the structure above, first passage-forming member 21, second passage-forming member 22, and planar member 23 are made of stainless or resin.

With the material above used, first passage-forming member 21, second passage-forming member 22, and planar member 23 are easily processed by molding, die-casting, and a lost-wax process. Besides, producing them in quantity contributes to significant reduction in processing cost.

Figure 4:
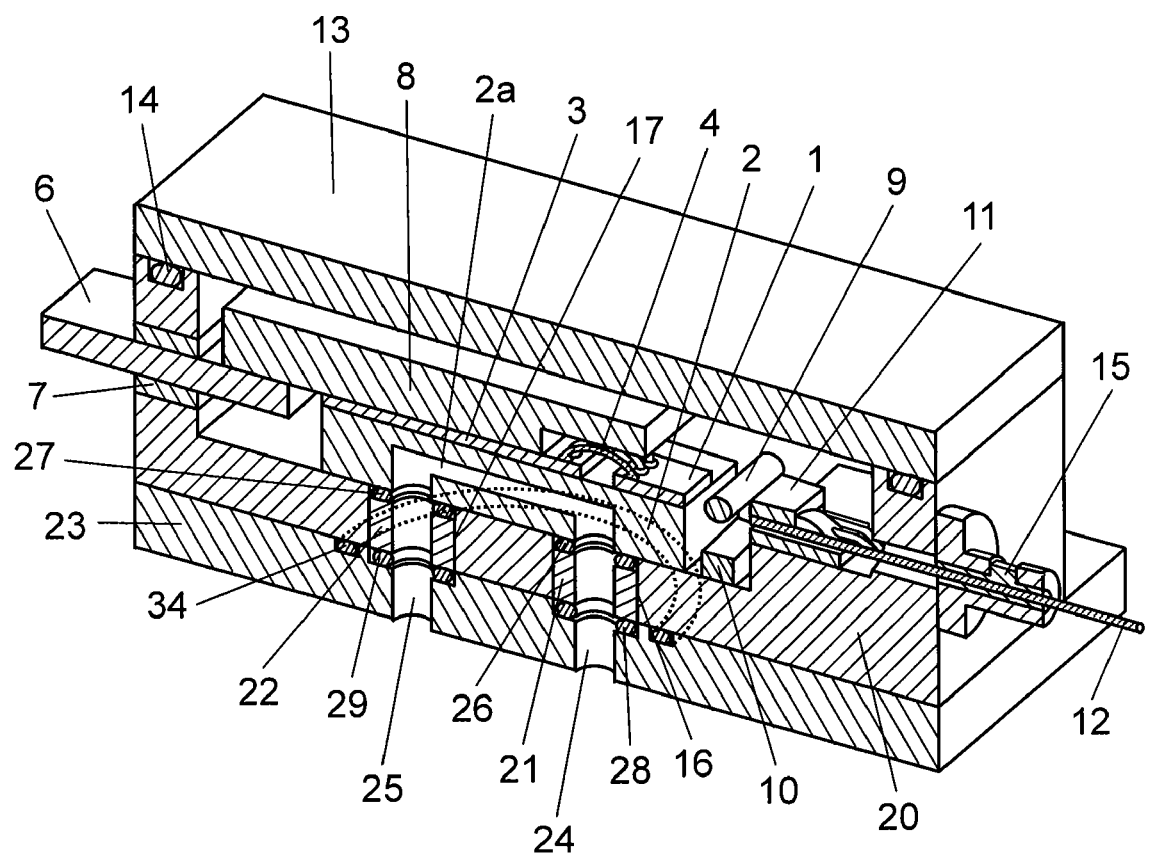
FIG. 4 is a partly cutout perspective view showing the semiconductor laser device in accordance with the second exemplary embodiment of the present invention.

As shown in FIG. 4, in the semiconductor laser device of the second embodiment, fifth sealing member 34 may be disposed between package 20 and planar member 23 in a manner that third sealing member 28 and fourth sealing member 29 are surrounded thereby for enhancing the hermetically sealed condition in package 20. That is, the semiconductor laser device of the present invention has the following sealing members: first sealing member 26, second sealing member 27, third sealing member 28, fourth sealing member 29, and fifth sealing member 34 that is disposed between housing 20 and heatsink 2 so as to surround first sealing member 26 and second sealing member 27. First sealing member 26 is disposed at the periphery of the connecting section of heatsink 2 and first passage-forming member 21. Second sealing member 27 is disposed at the periphery of the connecting section of heatsink 2 and second passage-forming member 22. Third sealing member 28 is disposed at the periphery of the connecting section of planar member 23 and first passage-forming member 21. Fourth sealing member 29 is disposed at the periphery of the connecting section of planar member 23 and second passage-forming member 22.

The structure above allows the cooling medium to be fed into cooling medium passage 2a of heatsink 2, enhancing cooling effect. The enhanced cooling capacity suppresses temperature rise of the inside of housing 20. In addition, doubly-provided sealing members block leakage of the cooling medium and ensure that the inside of package 20 is kept at hermetically sealed condition.

Figure 5:
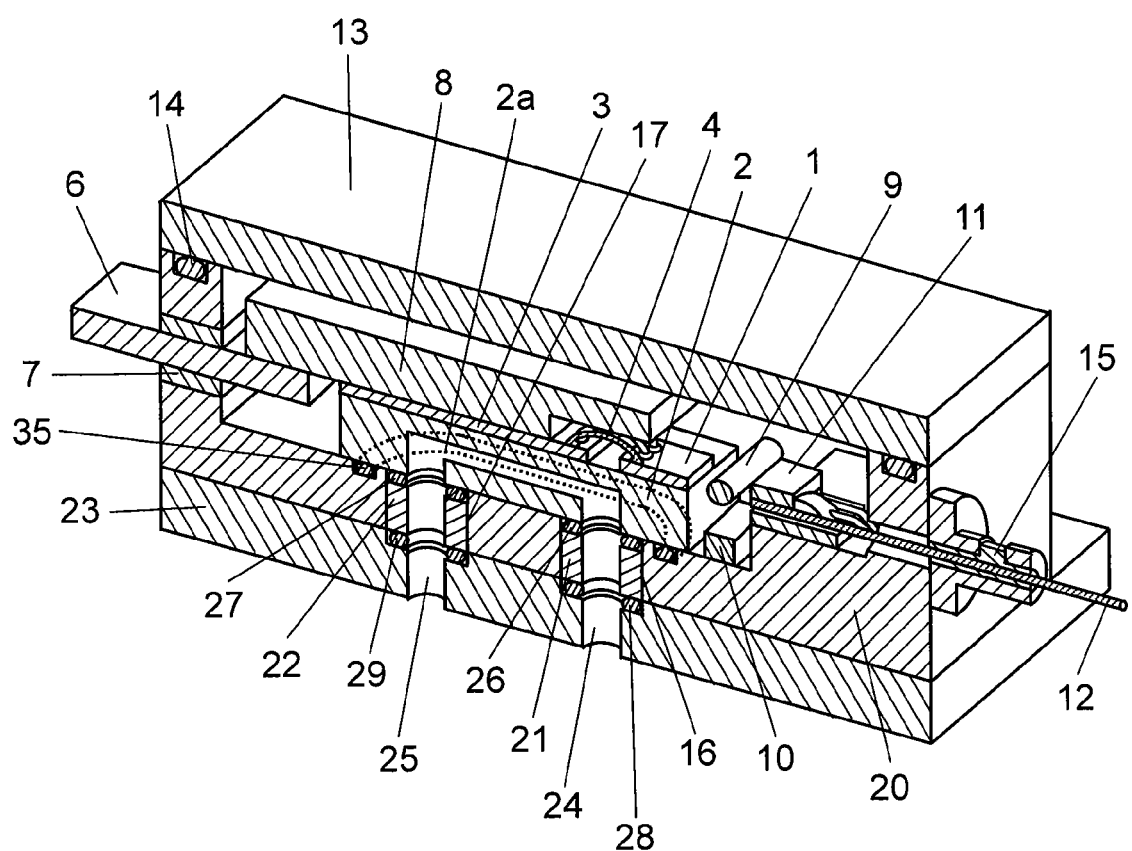
FIG. 5 is a partly cutout perspective view showing the semiconductor laser device in accordance with the second exemplary embodiment of the present invention.

Further, as shown in FIG. 5, the semiconductor laser device of the embodiment may be formed of a structure having fifth sealing member 35 for enhancing the hermetically sealed condition in package 20. In that case, fifth sealing member 35 is disposed between heatsink 2 and package 20 so as to surround first sealing member 26 and second sealing member 27. That is, the semiconductor laser device of the present invention has first sealing member 26, second sealing member 27, third sealing member 28, fourth sealing member 29, and fifth sealing member 35. Fifth sealing member 35 is disposed between housing 20 and planar member 23 so as to surround third sealing member 28 and fourth sealing member 29. First sealing member 26 is disposed at the periphery of the connecting section of heatsink 2 and first passage-forming member 21. Second sealing member 27 is disposed at the periphery of the connecting section of heatsink 2 and second passage-forming member 22. Third sealing member 28 is disposed at the periphery of the connecting section of planar member 23 and first passage-forming member 21. Fourth sealing member 29 is disposed at the periphery of the connecting section of planar member 23 and second passage-forming member 22.

The structure above allows the cooling medium to be fed into cooling medium passage 2a of heatsink 2, enhancing cooling effect. The enhanced cooling capacity suppresses temperature rise of the inside of housing 20. In addition, doubly-provided sealing members block leakage of the cooling medium and ensure that the inside of package 20 is kept at hermetically sealed condition.

According to the semiconductor laser device of the embodiment, as described above, first passage-forming member 21, second passage-forming member 22, and planar member 23 are made of a material with high corrosion resistance, while package 20 is made of a material with high electrical conductivity. Employing different materials for each member so as to be suitable for its use reduces the material cost and enhances volume efficiency of the product. The advantage provides the semiconductor laser module containing the semiconductor laser device with high reliability and quality and low production cost.

Besides, the structure above allows the cooling medium to be fed into the cooling medium passage of the heatsink, enhancing cooling effect. The enhanced cooling capacity suppresses temperature rise of the inside of the housing. In addition, doubly-provided sealing members block leakage of the cooling medium and ensure that the inside of the package is kept at hermetically sealed condition.

Third Exemplary Embodiment

Figure 6:
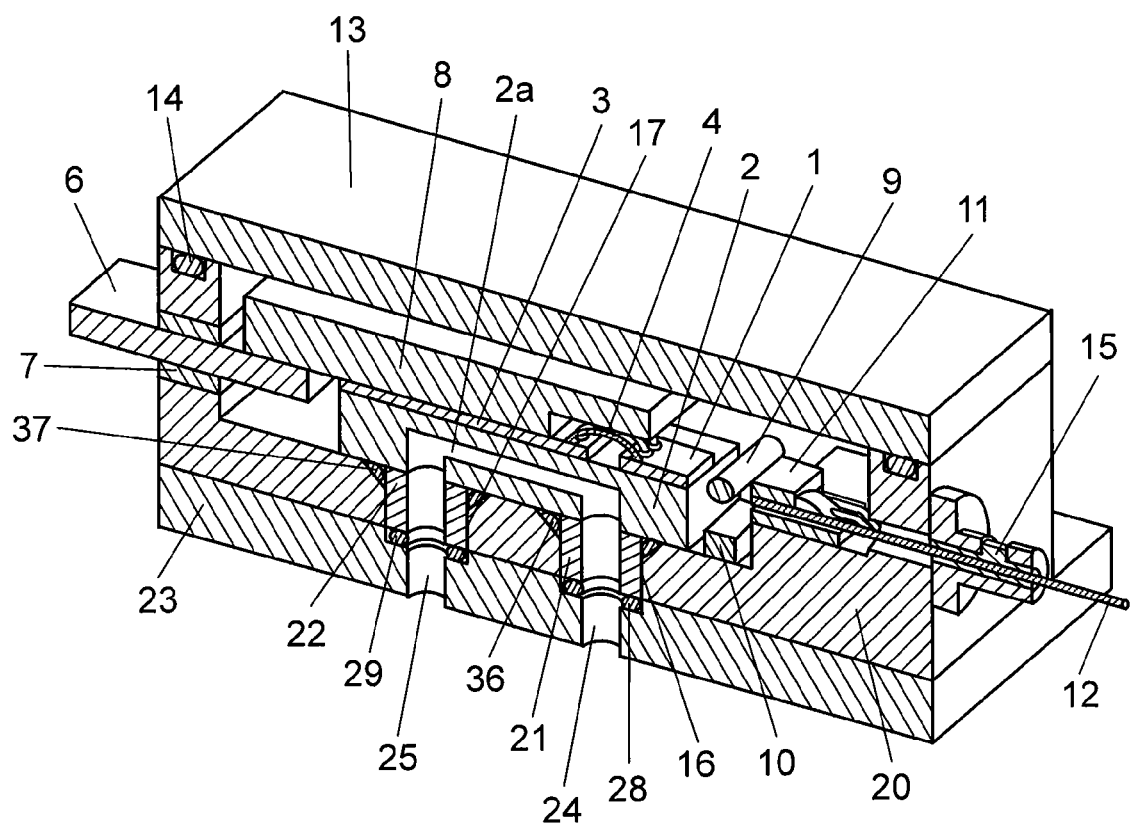
FIG. 6 is a partly cutout perspective view showing a semiconductor laser device in accordance with a third exemplary embodiment of the present invention.
Figure 7:
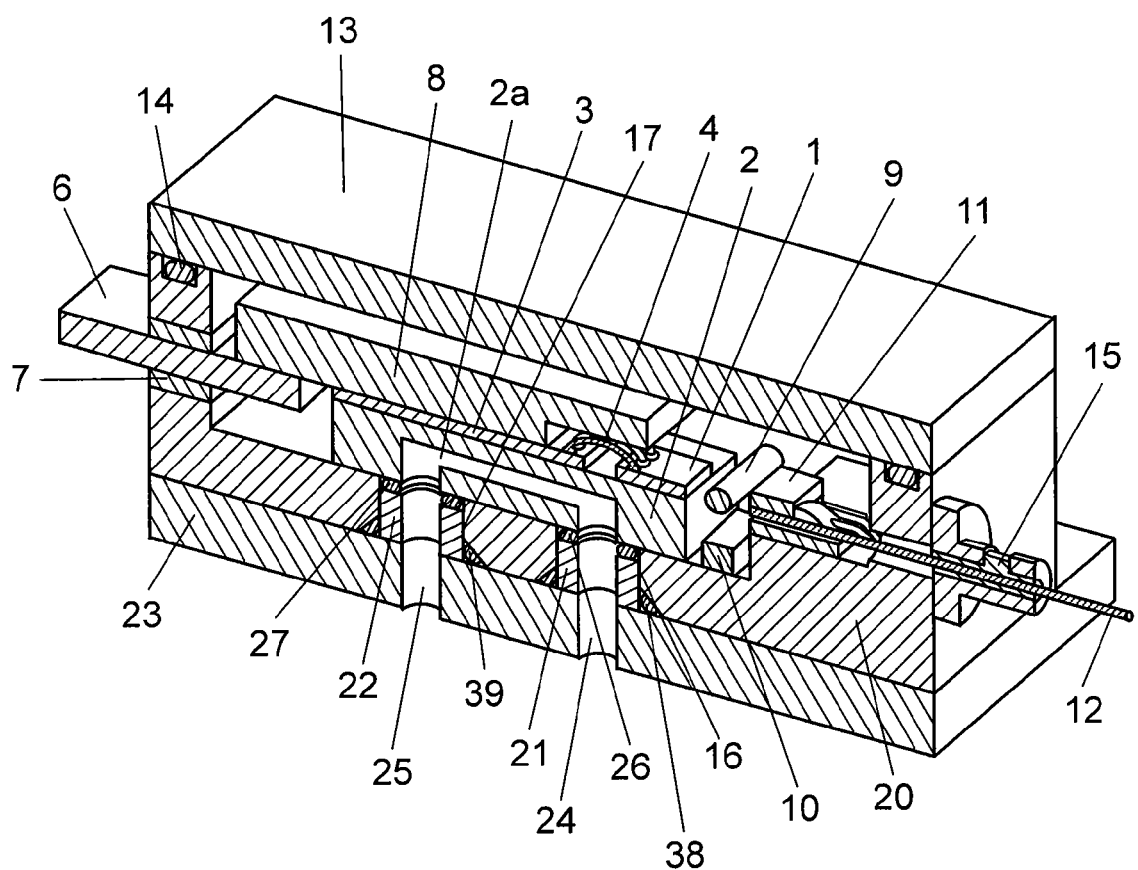
FIG. 7 is a partly cutout perspective view showing the semiconductor laser device in accordance with the third exemplary embodiment of the present invention.

FIGS. 6 and 7 are partly cutout perspective views showing a semiconductor laser device in accordance with the third exemplary embodiment of the present invention. As shown in FIG. 6, first sealing member 36 of the semiconductor laser device of the embodiment is disposed between heatsink 2, first passage-forming member 21, and package 20. First sealing member 36 not only prevents the cooling medium from leakage into the inside of package 20 but also keeps the inside of package 20 at hermetically sealed condition. Similarly, second sealing member 37 is disposed between heatsink 2, second passage-forming member 22, and package 20. Second sealing member 37 not only prevents the cooling medium from leakage into the inside of package 20 but also keeps the inside of package 20 at hermetically sealed condition.

In the semiconductor laser device of the embodiment, first sealing member 36 is disposed between package 20, heatsink 2, and first passage-forming member 21, while second sealing member 37 is disposed between heatsink 2, second passage-forming member 22, and package 20. Further, third sealing member 28 is disposed at the periphery of the connecting section of planar member 23 and first passage-forming member 21. Fourth sealing member 29 is disposed at the periphery of the connecting section of planar member 23 and second passage-forming member 22. In the semiconductor laser device of the embodiment, the sealing members for keeping the inside of package 20 at hermetically sealed condition differ in structure from those described in the second embodiment.

Specifically, to keep the inside of package 20 at hermetically sealed condition, any one of the following sealing members is needed for the structure of the semiconductor laser device of the second embodiment: fifth sealing member 30 and sixth sealing member 31 (of FIG. 2), fifth sealing member 32 and sixth sealing member 33 (of FIG. 3), fifth sealing member 34 (of FIG. 4), and fifth sealing member 35 (of FIG. 5).

According to the semiconductor laser device of the third embodiment, first sealing member 36 is employed for sealing between heatsink 2, package 20, and first passage-forming member 21; at the same time, second sealing member 37 is employed for sealing between heatsink 2, package 20, and second passage-forming member 22. That is, in the semiconductor laser device of the present invention, first sealing member 36 is disposed between housing 20, heatsink 2, and first passage-forming member 21; similarly, second sealing member 37 is disposed between housing 20, heatsink 2, and second passage-forming member 22. In addition, third sealing member 28 is disposed at the periphery of the connecting section of planar member 23 and first passage-forming member 21, and fourth sealing member 29 is disposed at the periphery of the connecting section of planar member 23 and second passage-forming member 22.

With the structure above, the effective use of sealing members 36 and 37 not only prevents the cooling medium from leakage but also keeps the inside of package 20 at hermetically sealed condition.

The semiconductor laser device may be formed of the structure shown in FIG. 7. That is, third sealing member 38 is disposed between planar member 23, package 20, and first passage-forming member 21; similarly, fourth sealing member 39 is disposed between planar member 23, package 20, and second passage-forming member 22. Such disposed sealing members also prevent the cooling medium from leakage and keep the inside of package 20 at hermetically sealed condition. That is, the semiconductor laser device of the present invention has first sealing member 26, second sealing member 27, third sealing member 38, and fourth sealing member 39. First sealing member 26 is disposed at the periphery of the connecting section of heatsink 2 and first passage-forming member 21. Second sealing member 27 is disposed at the periphery of the connecting section of heatsink 2 and second passage-forming member 22. Third sealing member 38 is disposed between housing 20, planar member 23, and first passage-forming member 21. Fourth sealing member 39 is disposed between housing 20, planar member 23, and second passage-forming member 22.

With the structure above, the effective use of sealing members 38 and 39 not only prevents the cooling medium from leakage but also keeps the inside of package 20 at hermetically sealed condition.

As described above, employing the semiconductor laser device of the third embodiment eliminates the need for using sealing members 30 and 31 (FIG. 2), sealing members 32 and 33 (FIG. 3), sealing member 34 (FIG. 4), and sealing member 35 (FIG. 5), which are used for only keeping the inside of housing 20 at hermetically sealed condition. Accordingly, there is no need for holding structures for the sealing members above. Such a simplified structure contributes to cost reduction, offering the semiconductor laser device at low cost.

Fourth Exemplary Embodiment

Figure 8:
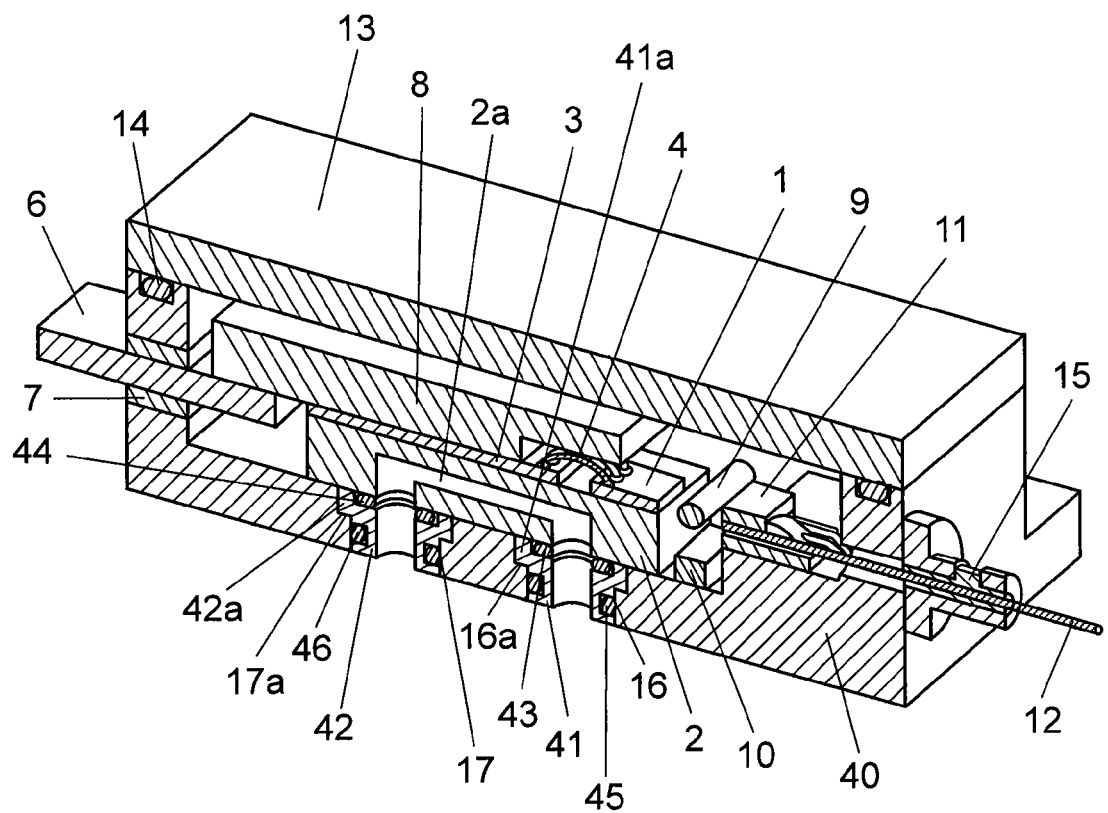
FIG. 8 is a partly cutout perspective view showing a semiconductor laser device in accordance with a fourth exemplary embodiment of the present invention.
Figure 9:
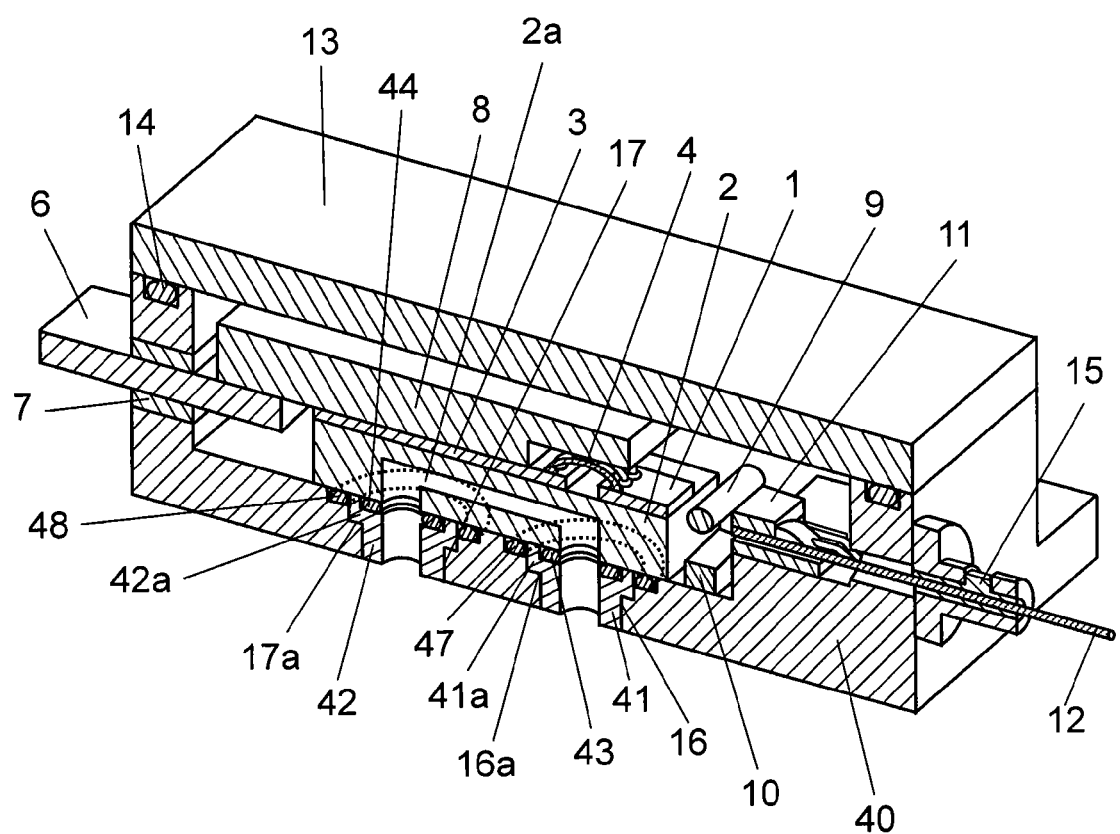
FIG. 9 is a partly cutout perspective view showing the semiconductor laser device in accordance with the fourth exemplary embodiment of the present invention.
Figure 10:
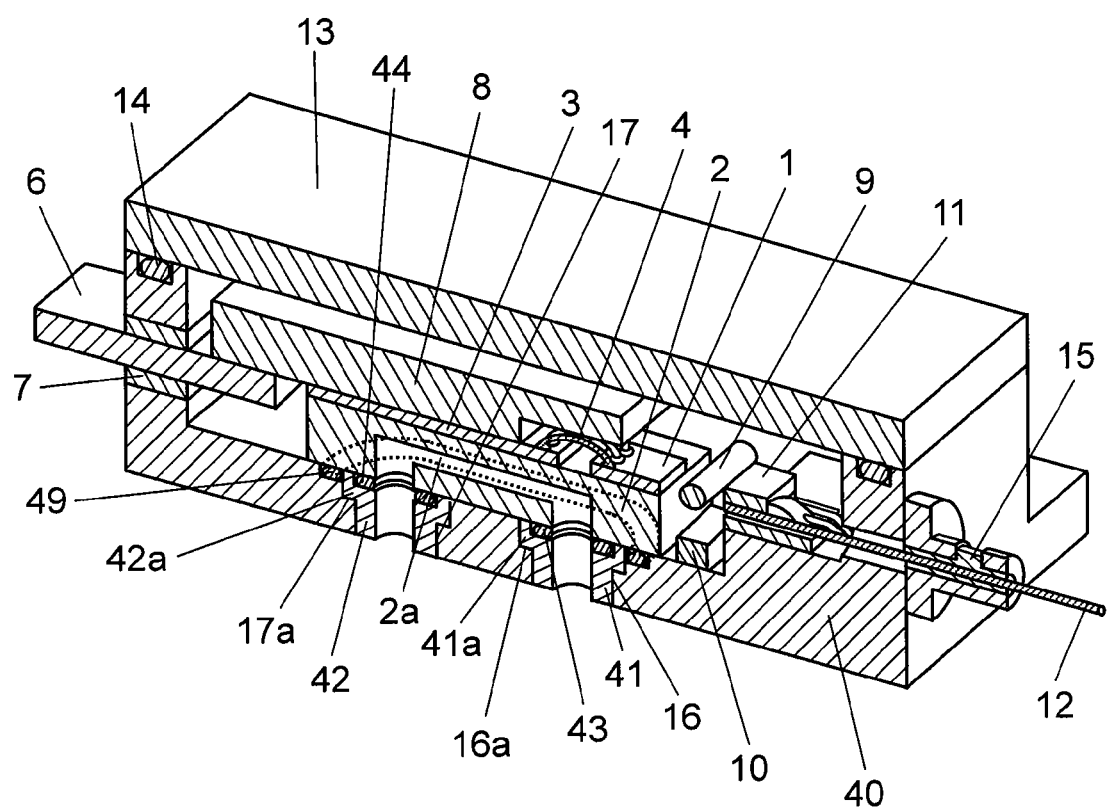
FIG. 10 is a partly cutout perspective view showing the semiconductor laser device in accordance with the fourth exemplary embodiment of the present invention.

FIGS. 8 through 10 are partly cutout perspective views showing the semiconductor laser device in accordance with the fourth exemplary embodiment of the present invention. The semiconductor laser device of the embodiment shown in FIG. 8 has package 40 of a box shape, first passage-forming member 41 disposed in package 40, second passage-forming member 42 disposed in package 40, first sealing member 43, second sealing member 44, third sealing member 45, and fourth sealing member 46. First sealing member 43 is disposed between heatsink 2 and first passage-forming member 41 so as to prevent the cooling medium from leakage into the inside of package 40. Similarly, second sealing member 44 is disposed between heatsink 2 and second passage-forming member 42 so as to prevent the cooling medium from leakage into inside of package 40. Third sealing member 45 is disposed between package 40 and first passage-forming member 41 so as to keep the inside of package 40 at hermetically sealed condition. Similarly, fourth sealing member 46 is disposed between package 40 and second passage-forming member 42 so as to keep the inside of package 40 at hermetically sealed condition.

The semiconductor laser device of the fourth embodiment has package 40 as a housing, heatsink 2 disposed in package 40, and semiconductor laser element 1 as a laser output section fixed directly or indirectly to heatsink 2. Heatsink 2 has a cooling medium passage therein. First through-hole 16 and second through-hole 17 are formed in a wall surface of package 40. First passage-forming member 41 is disposed inside first through-hole 16, and second passage-forming member 42 is disposed inside second through-hole 17. First passage-forming member 41 has a passage for feeding a cooling medium to heatsink 2, while second passage-forming member 42 has a passage for discharging the cooling medium from heatsink 2. In addition, at least any one of first passage-forming member 41 and second passage-forming member 42 have stepped sections 16a and 17a disposed so as to fit with a portion of first through-hole 16 and a portion of second through-hole 17, respectively, in package 40.

The structure above allows the cooling medium to be fed into cooling medium passage 2a of heatsink 2, enhancing cooling effect. The enhanced cooling capacity suppresses temperature rise of the inside of housing 40. In addition, employing stepped sections 16a, 17a and a sealing member prevents the cooling medium from leakage and keeps the inside of housing 40 at hermetically sealed condition (, which will be described later).

Hereinafter, the features of the semiconductor laser device of the fourth embodiment will be described specifically. When a semiconductor laser device contains cylindrical passage-forming members 21 and 22 described in the second and the third embodiments, the device needs planar member 23 that prevents falling out of passage-forming members 21 and 22 from housing 20. At the same time, the device needs a sealing structure for keeping the inside of package 20 at hermetically sealed condition.

According to the semiconductor laser device of the fourth embodiment, at least any one of first passage-forming member 41 and second passage-forming member 42 have outwardly projecting stepped sections 41a and 42a (FIG. 8) disposed so as to fit with a portion of first through-hole 16 and a portion of second through-hole 17, respectively, in package 40. At the same time, through-holes 16 and 17 have outwardly projecting stepped sections 16a and 17a so as to fit with stepped sections 41a and 42a of passage-forming members 41 and 42, respectively. The structure prevents falling out of passage-forming members 41 and 42 from through-holes 16a and 17a of package 40.

Besides, to keep the inside of package 40 at hermetically sealed condition, sealing member 45 is disposed between package 40 and passage-forming member 41; similarly, sealing member 46 is disposed between package 40 and passage-forming member 42. The structure eliminates the need for using planar member 23, allowing the semiconductor laser device to be manufactured at low cost.

Housing 40 is made of a metal containing aluminum as a major component, while first passage-forming member 41 and second passage-forming member 42 are made of a material having a corrosion resistance higher than that of aluminum.

The material selection above prevents first passage-forming member 41 and second passage-forming member 42—through which the cooling medium runs—from corrosion. As a result, semiconductor laser element 1 is efficiently cooled by the cooling medium, by which temperature rise in the device is suppressed.

To be specific, first passage-forming member 41 and second passage-forming member 42 are made of stainless or resin. With the material above used, first passage-forming member 41 and second passage-forming member 42 are easily processed by molding, die-casting, and a lost-wax process. Besides, producing them in quantity contributes to significant reduction in processing cost.

In the structure above, to keep the inside of package 40 at hermetically sealed condition, sealing members 45 and 46 may be disposed around passage-forming members 41 and 42, respectively, between heatsink 2 and package 40, just like sealing members 47 and 48 disposed in the semiconductor laser device shown in FIG. 9.

According to the semiconductor laser device of the present invention, first sealing member 43 is disposed at the periphery of the connecting section of heatsink 2 and first passage-forming member 41. Second sealing member 44 is disposed at the periphery of the connecting section of heatsink 2 and second passage-forming member 42. Third sealing member 47 is disposed around the periphery of first sealing member 43. Fourth sealing member 48 is disposed around the periphery of second sealing member 44. First sealing member 43 and second sealing member 44 may be disposed between housing 40 and heatsink 2.

The structure above allows the cooling medium to be fed into cooling medium passage 2a of heatsink 2, enhancing cooling effect. The enhanced cooling capacity suppresses temperature rise of the inside of housing 40. In addition, employing stepped sections 16a, 17a and a sealing member prevents the cooling medium from leakage and keeps the inside of housing 40 at hermetically sealed condition. At the same time, the structure eliminates the need for using planar member 23, reducing the production cost of the semiconductor laser device.

In the semiconductor laser device of the fourth embodiment, to keep the inside of package 40 at hermetically sealed condition, fifth sealing member 49 be disposed around passage-forming members 41 and 42 between heatsink 2 and package 40, as shown in FIG. 10.

That is, the semiconductor laser device of the present invention has first sealing member 43, second sealing member 44, and fifth sealing member 49 disposed between housing 40 and heatsink 2 so as to surround first sealing member 43 and second sealing member 44. First sealing member 43 is disposed at the periphery of the connecting section of heatsink 2 and first passage-forming member 41. Second sealing member 44 is disposed at the periphery of the connecting section of heatsink 2 and second passage-forming member 42.

The structure above allows the cooling medium to be fed into cooling medium passage 2a of heatsink 2, enhancing cooling effect. The enhanced cooling capacity suppresses temperature rise of the inside of housing 40. In addition, employing stepped sections 16a, 17a and a sealing member prevents the cooling medium from leakage and keeps the inside of housing 40 at hermetically sealed condition. At the same time, the structure eliminates the need for using planar member 23, reducing the production cost of the semiconductor laser device.

The semiconductor laser device of the fourth embodiment, as described above, has no need for using planar member 43 that supports passage-forming members 41 and 42 and keeps the inside of package 40 at hermetically sealed condition, contributing to cost reduction. Accordingly, a cost-reduced semiconductor laser device is obtained.

Fifth Exemplary Embodiment

Figure 11:
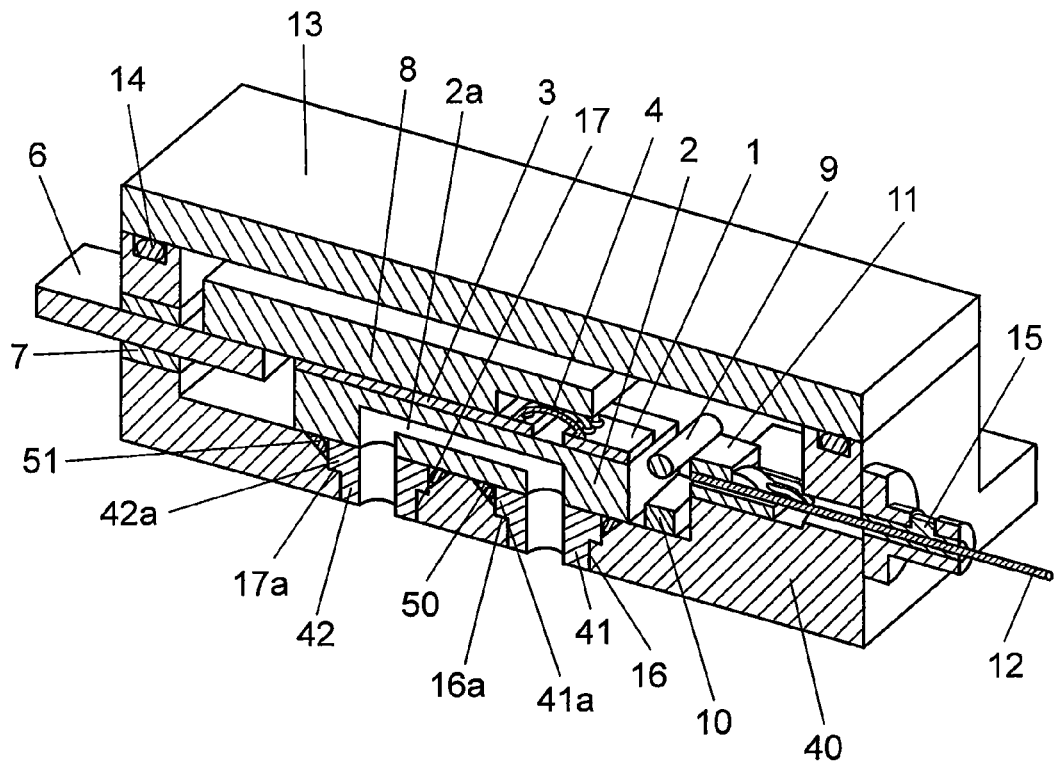
FIG. 11 is a partly cutout perspective view showing a semiconductor laser device in accordance with a fifth exemplary embodiment of the present invention.
Figure 12:
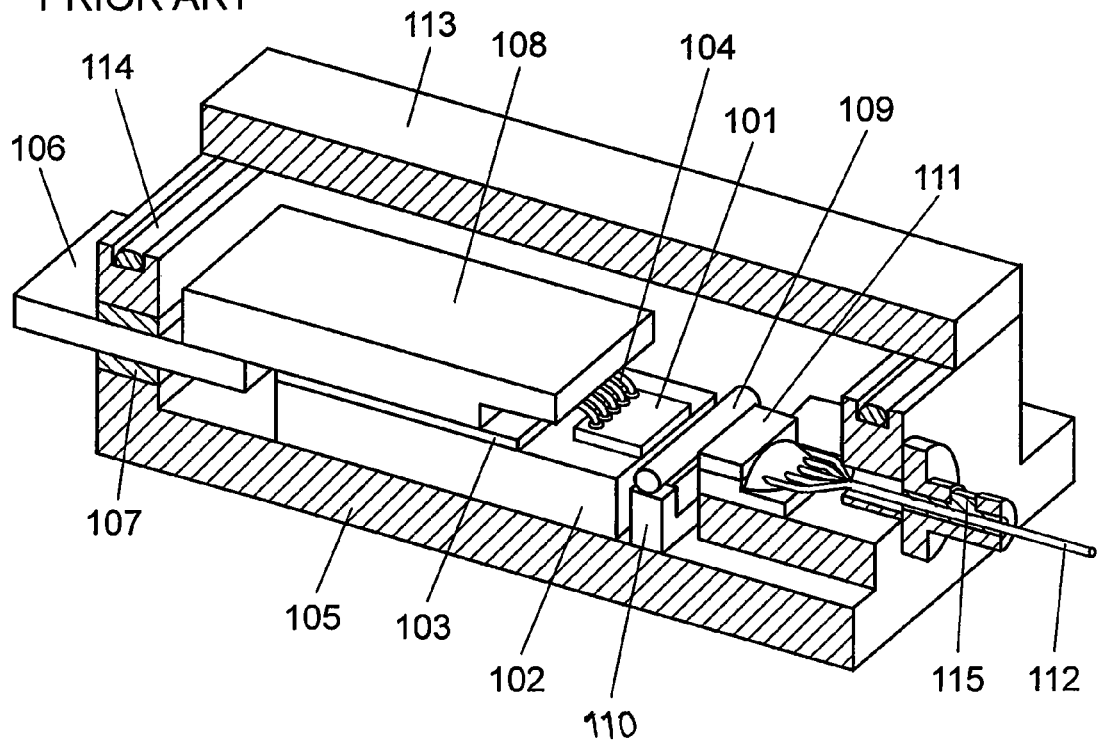
FIG. 12 is a partly cutout perspective view showing a conventional semiconductor laser device.

FIG. 11 is a partly cutout perspective view showing a semiconductor laser device in accordance with the fifth exemplary embodiment of the present invention. In the semiconductor laser device of FIG. 11, first sealing member 50 is disposed between heatsink 2, first passage-forming member 41, and package 40. Second sealing member 51 is disposed between heatsink 2, second passage-forming member 42, and package 40. Sealing members 50 and 51 prevent the cooling medium from leakage into the inside of package 40, and at the same time, they keep the inside of package 40 at hermetically sealed condition.

Unlike the semiconductor laser device of the fourth embodiment, the structure of the fifth embodiment has no need for using sealing members 45 and 46, sealing members 47 and 48, or sealing member 49 each of which is for only keeping the inside of package 40 at hermetically sealed condition.

As for the semiconductor laser device described in the fourth embodiment, sealing members 45 and 46, sealing member 47 and 48, or sealing member 49 have to be disposed at proper positions shown in FIG. 8 through FIG. 10.

According to the semiconductor laser device of the fifth embodiment, first sealing member 50 seals between heatsink 2, package 40, and first passage-forming member 41; similarly, second sealing member 51 seals between heatsink 2, package 40, and second passage-forming member 42.

That is, in the semiconductor laser device of the present invention, first sealing member 50 is disposed between housing 40, heatsink 2, and first passage-forming member 41, while second sealing member 51 is disposed between housing 40, heatsink 2, and second passage-forming member 42.

The structure above—where sealing member 50 is disposed at first through-hole 16 and sealing member 51 is disposed at second through-hole 17—not only prevents leakage of the cooling medium but also keeps the inside of package 40 at hermetically sealed condition.

The semiconductor laser device of the fifth embodiment, as described above, has no need for using sealing members 45 and 46, sealing member 47 and 48, or sealing member 49 for only keeping the inside of package 40 at hermetically sealed condition. At the same time, the structure eliminates the need for a supporting member therefore, reducing the production cost of the semiconductor laser device.

In the structures described in the first through the fifth embodiments of the present invention, the cooling medium passage of the semiconductor laser device is not necessarily formed in the direction shown in FIG. 1 through FIG. 11; the cooling medium passage may be formed in a direction perpendicular to that shown in the drawings, or two-or-more passages may cross with each other at an angle. In the structure above, to enhance the cooling capacity of the semiconductor laser device and enhance the laser output, the cooling medium passage—at least a part thereof—should preferably be formed immediately or nearly beneath the laser light emitting section.

Industrial Applicability

The semiconductor laser device of the present invention has an enhanced cooling capacity by the structure where the cooling medium directly runs through the heatsink disposed inside the housing. It ensures that the semiconductor laser device has high reliability and quality. Besides, a high-power semiconductor laser element can be mounted thereon. It is therefore suitable for the laser device that employs semiconductor laser light for a direct process light source or excitation light.

Reference Marks in the Drawings
1 semiconductor laser element (laser output section)
2 heatsink
2a cooling medium passage
3 metallic plate
4 metallic wire
5, 20, 40 package (housing)
6 electrode plate
7 insulating member
8 metallic member
9 rod lens
10 lens fixing base
11 fiber array
12 optical fiber
13 lid
14, 15 sealing member
16 first through-hole
16a, 17a, 41a, 42a stepped section
17 second through-hole
18, 26, 36, 43, 50 first sealing member
19, 27, 37, 44, 51 second sealing member
21, 41 first passage-forming member
22, 42 second passage-forming member
23 planar member
24 third through-hole
25 fourth through-hole
28, 38, 45, 47 third sealing member
29, 39, 46, 48 fourth sealing member
30, 32, 34, 35, 49 fifth sealing member
31, 33 sixth sealing member

The invention claimed is:

1. A semiconductor laser device comprising:
a housing;
a heatsink having a cooling medium passage therein, the heatsink disposed in the housing;
a laser output section directly or indirectly fixed to the heatsink; and
a planar member disposed outside a wall surface of wall surfaces forming the housing,
wherein, the housing has a first through-hole and a second through-hole in the wall surface facing the planar member, a first passage-forming member having a passage for feeding a cooling medium to the cooling medium passage of the heatsink is disposed inside the first through-hole, a second passage-forming member having a passage for discharging the cooling medium from the cooling medium passage of the heatsink is disposed inside the second through-hole, a third through-hole for feeding the cooling medium to the cooling medium passage of the heatsink is formed in the planar member at a position that meets with the first passage-forming member, and a fourth through-hole for discharging the cooling medium from the cooling medium passage of the heatsink is formed in the planar member at a position that meets with the second passage-forming member.

2. The semiconductor laser device according to claim 1, wherein the housing is made of a metal containing aluminum as a major component, while the first passage-forming member, the second passage-forming member, and the planar member are made of a material having a corrosion resistance higher than that of aluminum.

3. The semiconductor laser device according to claim 2, wherein the first passage-forming member, the second passage-forming member, and the planar member are made of stainless or resin.

4. The semiconductor laser device according to claim 1, wherein a first sealing member is disposed at a periphery of a connecting section of the heatsink and the first passage-forming member, a second sealing member is disposed at a periphery of a connecting section of the heatsink and the second passage-forming member, a third sealing member is disposed at a periphery of a connecting section of the planar member and the first passage-forming member, a fourth sealing member is disposed at a periphery of a connecting section of the planar member and the second passage-forming member, a fifth sealing member is disposed around a periphery of the third sealing member between the housing and the planar member, and a sixth sealing member is disposed around a periphery of the fourth sealing member between the housing and the planar member.

5. The semiconductor laser device according to claim 1, wherein a first sealing member is disposed at a periphery of a connecting section of the heatsink and the first passage-forming member, a second sealing member is disposed at a periphery of a connecting section of the heatsink and the second passage-forming member, a third sealing member is disposed at a periphery of a connecting section of the planar member and the first passage-forming member, a fourth sealing member is disposed at a periphery of a connecting section of the planar member and the second passage-forming member, a fifth sealing member is disposed around a periphery of the first sealing member between the housing and the heatsink, and a sixth sealing member is disposed around a periphery of the second sealing member between the housing and the heatsink.

6. The semiconductor laser device according to claim 1, wherein a first sealing member is disposed at a periphery of a connecting section of the heatsink and the first passage-forming member, a second sealing member is disposed at a periphery of a connecting section of the heatsink and the second passage-forming member, a third sealing member is disposed at a periphery of a connecting section of the planar member and the first passage-forming member, a fourth sealing member is disposed at a periphery of a connecting section of the planar member and the second passage-forming member, and a fifth sealing member is disposed between the housing and the heatsink so as to surround the first sealing member and the second sealing member.

7. The semiconductor laser device according to claim 1, wherein a first sealing member is disposed at a periphery of a connecting section of the heatsink and the first passage-forming member, a second sealing member is disposed at a periphery of a connecting section of the heatsink and the second passage-forming member, a third sealing member is disposed at a periphery of a connecting section of the planar member and the first passage-forming member, a fourth sealing member is disposed at a periphery of a connecting section of the planar member and the second passage-forming member, and a fifth sealing member is disposed between the housing and the planar member so as to surround the third sealing member and the fourth sealing member.

8. The semiconductor laser device according to claim 1, wherein a first sealing member is disposed between the housing, the heatsink, and the first passage-forming member, a second sealing member is disposed between the housing, the heatsink, and the second passage-forming member, a third sealing member is disposed at a periphery of a connecting section of the planar member and the first passage-forming member, and a fourth sealing member is disposed at a periphery of a connecting section of the planar member and the second passage-forming member.

9. The semiconductor laser device according to claim 1, wherein a first sealing member is disposed at a periphery of a connecting section of the heatsink and the first passage-forming member, a second sealing member is disposed at a periphery of a connecting section of the heatsink and the second passage-forming member, a third sealing member is disposed between the housing, the planar member, and the first passage-forming member, and a fourth sealing member is disposed between the housing, the planar member, and the second passage-forming member.

10. A semiconductor laser device comprising:
   a housing;
   a heatsink having a cooling medium passage therein, the heatsink disposed in the housing; and
   a laser output section directly or indirectly fixed to the heatsink,
   wherein, a first through-hole and a second through-hole are formed in a wall surface of the housing, a first passage-forming member having a passage for feeding a cooling medium to the heatsink is disposed inside the first through-hole, a second passage-forming member having a passage for discharging the cooling medium from the heatsink, and at least any one of the first passage-forming member and the second passage-forming member has a stepped section that fits with a portion of the first through-hole and a portion of the second through-hole, respectively, of the housing.

11. The semiconductor laser device according to claim 10, wherein the housing is made of a metal containing aluminum as a major component, while the first passage-forming member, the second passage-forming member, and the planar member are made of a material having a corrosion resistance higher than that of aluminum.

12. The semiconductor laser device according to the claim 11, wherein the first passage-forming member and the second passage-forming member are made of stainless or resin.

13. The semiconductor laser device according to claim 10, wherein a first sealing member is disposed at a periphery of a connecting section of the heatsink and the first passage-forming member, a second sealing member is disposed at a periphery of a connecting section of the heatsink and the second passage-forming member, a third sealing member is disposed around a periphery of the first sealing member, and a fourth sealing member is disposed around a periphery of the second sealing member.

14. The semiconductor laser device according to claim 10, wherein a first sealing member is disposed at a periphery of a connecting section of the heatsink and the first passage-forming member, a second sealing member is disposed at a periphery of a connecting section of the heatsink and the second passage-forming member, a third sealing member is disposed around a periphery of the first sealing member between the housing and the heatsink, and a fourth sealing member is disposed around a periphery of the second sealing member between the housing and the heatsink.

15. The semiconductor laser device according to claim 10, wherein a first sealing member is disposed at a periphery of a connecting section of the heatsink and the first passage-forming member, a second sealing member is disposed at a periphery of a connecting section of the heatsink and the second passage-forming member, a fifth sealing member is disposed between the housing and the heatsink so as to surround the first sealing member and the second sealing member.

16. The semiconductor laser device according to claim 10, wherein a first sealing member is disposed between the housing, the heatsink, and the first passage-forming member, and a second sealing member is disposed between the housing, the heatsink and the second passage-forming member.

* * * * *